(12) United States Patent
Odegard

(10) Patent No.: US 7,598,124 B2
(45) Date of Patent: Oct. 6, 2009

(54) SYSTEM AND METHOD TO INCREASE DIE STAND-OFF HEIGHT

(75) Inventor: Charles Anthony Odegard, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 489 days.

(21) Appl. No.: 11/422,446

(22) Filed: Jun. 6, 2006

(65) Prior Publication Data

US 2006/0211172 A1 Sep. 21, 2006

Related U.S. Application Data

(62) Division of application No. 10/444,772, filed on May 22, 2003, now Pat. No. 7,224,071.

(51) Int. Cl.
*H01L 21/44* (2006.01)
*H01L 21/48* (2006.01)
*H01L 21/50* (2006.01)

(52) U.S. Cl. .......... 438/117; 438/118; 438/612
(58) Field of Classification Search ........ 438/108, 438/117, 118, 612; 257/778
See application file for complete search history.

(56) References Cited

U.S. PATENT DOCUMENTS 5,633,535 A * 5/1997 Chao et al. ............ 257/778
6,649,444 B2 * 11/2003 Earnworth et al. ........ 438/108

* cited by examiner

*Primary Examiner*—Thien F Tran
(74) *Attorney, Agent, or Firm*—Yingsheng Tung; Wade J. Brady, III; Frederick J. Telecky, Jr.

(57) ABSTRACT

In accordance with the present invention, a system and method to increase die stand-off height in a flip chip are provided. The system includes a plurality of separator pedestals disposed between a first face of a die and a second face of a substrate, the substrate positioned generally parallel with, and spaced apart from, the die, and the first face being opposite the second face. The plurality of separator pedestals are operable to selectively force the die and substrate apart, increasing the stand-off height of the flip chip assembly.

18 Claims, 3 Drawing Sheets

SYSTEM AND METHOD TO INCREASE DIE STAND-OFF HEIGHT

This application is a divisional of application Ser. No. 10/444,772 filed May 22, 2003, now U.S. Pat. No. 7,224,071 the contents of which are herein incorporated by reference in its entirety.

TECHNICAL FIELD OF THE INVENTION

The present invention relates in general to semiconductor manufacturing and, in particular, to a system and method to increase die stand-off height in a flip chip.

BACKGROUND OF THE INVENTION

Flip chips are microelectronic devices in which a silicon chip, or die, is attached facedown to a substrate via a plurality of small solder bumps. In general, a die attach system "picks and places" the die directly from a silicon wafer and places the die on the substrate using a plurality of solder bumps to form an electrical connection between the two. Once the solder has been reflowed and solidified, a non-conductive underfill material is typically inserted into the gap between the die and substrate to strengthen the connection between the two and to provide a barrier to moisture or other contaminants.

As chip sizes have decreased over time, flip chip assemblies have also decreased in size. These smaller chip sizes require narrower bump pitches and, therefore, smaller bump sizes. This typically results in the flip chip having a decreased stand-off height between the die and the substrate, which may increase the level of stress at the connection between the solder bumps and the die due to the differences in the coefficients of thermal expansion (CTE) of the die and the substrate. Additionally, the decreased stand-off height may make inserting an underfill material between the die and substrate more challenging as many underfill materials resist flowing between a die and substrate with a small stand-off height.

SUMMARY OF THE INVENTION

In accordance with the present invention, a system and method to increase the stand-off height in a flip chip are provided. The system comprises a plurality of separator pedestals disposed between a first face of a die and a second face of a substrate, the substrate positioned generally parallel with, and spaced apart from, the die, and the first face being opposite the second face. The plurality of separator pedestals are operable to selectively force the die and substrate apart, increasing the stand-off height of the flip chip assembly.

Technical advantages of particular embodiments of the present invention include a system and method to increase die stand-off height in a flip chip that reduce the stress concentrations associated with solder joint formation at the interconnect layers of the die above the solder bumps due to the differences in the CTE of the die and the substrate.

Another technical advantage of particular embodiments of the present invention is a system and method of increase die stand-off height in a flip chip that facilitates the insertion of underfill material between the die and substrate to strengthen the coupling between the two and to serve as a barrier to moisture and/or other contaminants.

Other technical advantages will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following descriptions, taken in conjunction with the accompanying drawings, in which.

DETAILED DESCRIPTION OF THE INVENTION

Figure 1A:
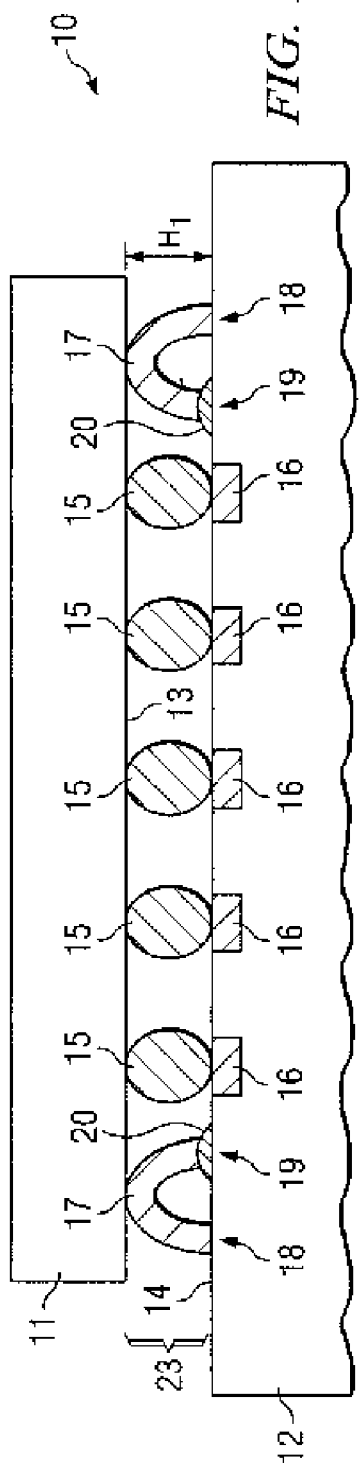
FIG. 1A illustrates a side view of a flip chip assembly employing a system for increasing die stand-off height, in accordance with a particular embodiment of the present invention, prior to the reflow of the solder bumps of the flip chip assembly.
Figure 1B:
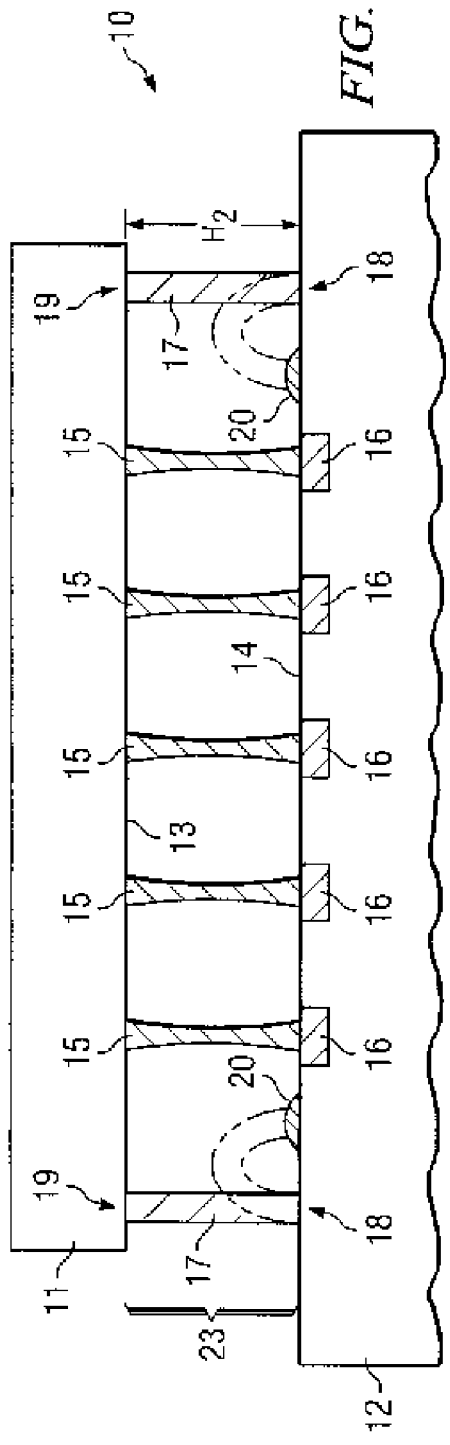
FIG. 1B illustrates a side view of the flip chip assembly shown in FIG. 1A following the reflow of the solder bumps and deployment of the separator pedestals of the flip chip assembly.
Figure 1C:
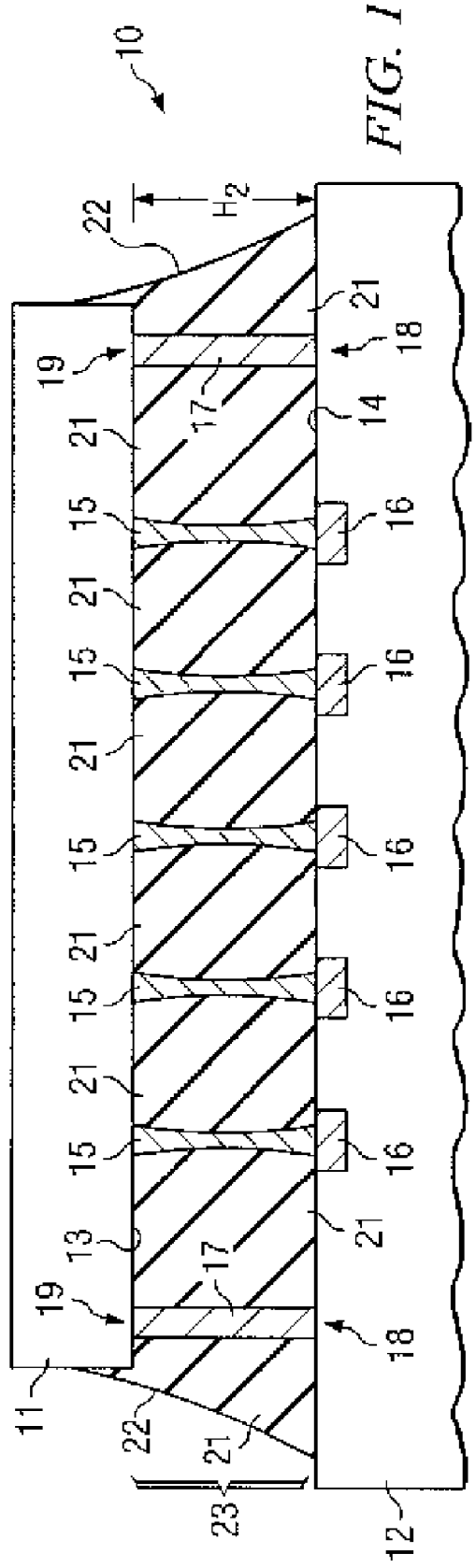
FIG. 1C illustrates a side view of the flip chip assembly shown in FIG. 1B with an underfill material disposed in the gap between the die and substrate of the flip chip assembly.

FIGS. 1A-1C illustrate flip chip assembly 10 in accordance with a particular embodiment of the present invention. Flip chip assembly 10 employs a plurality of separator pedestals to increase the die stand-off height of the flip chip. After the solder bumps connecting the die and substrate have been reflowed (i.e., melted), such that they adhere to both the die and the substrate, the pedestals "pop-up", or extend from a deformed state, to force the die and substrate apart, while still maintaining the connection between the solder bumps and the die and substrate. This increases the stand-off height between the die and substrate and elongates the solder bumps into solder columns. This helps to reduce the amount of stress experienced at the connection between the solder columns and die due to any differences in the CTEs of the two materials and eases the insertion of underfill material into the gap between the die and substrate.

As shown in FIGS. 1A-1C, flip chip assembly 10 includes die 11 and substrate 12, which are positioned generally parallel with, and spaced apart from, each other. Typically, die 11 is a silicon chip positioned facedown over substrate 12. Substrate 12, on the other hand, is typically constructed using ceramic or organic materials, and is operable to provide a electrical connection between die 11 and an external device (not illustrated) when electrically coupled with die 11. This allows the die 11 to be packaged more robustly and with greater package density, while at the same time offering improved heat dissipation, high self-alignment, and tighter assembly tolerances.

Flip chip assembly 10 also includes a plurality of solder bumps 15 disposed within the gap 23 between die 11 and substrate 12. These solder bumps 15 typically comprise eutectic tin-lead (Sn/Pb), high lead (Pb), or tin-silver (Sn/Ag) composition solders, although other solders and solder compositions may be used as well.

Generally, the plurality of solder bumps 32 is first applied to die 30 in a process referred to as "bumping". In this process, solder bumps 32 are connected to the interconnect layer (not illustrated) on the lower face 33 of die 30. Die 11 and the attached solder bumps 15 are then positioned over substrate 12 such that each solder bump 15 is aligned with a corresponding bump pad 16 on face 14 of substrate 12, in what is referred to as a "pick and place" operation. With the plurality of solder bumps 15 disposed between the interconnect layer of die 11 and the bump pads 16 of substrate 12, a rigid connection may be formed between die 11 and substrate 12 by reflowing and then solidifying the plurality of solder bumps 15.

Flip chip assembly 10 also includes a plurality of separator pedestals 17 operable to selectively force die 11 and substrate 12 apart, increasing the stand-off height of the chip assembly. In particular embodiments of the present invention, each separator pedestal 17 includes a resilient member biased to maintain, or at least attempt to return to, an erect orientation, perpendicular to face 13 of die 11 and face 14 of substrate 12. Examples of materials that could be used to construct these resilient members include a number of metal alloys, polymers, or shape memory materials that have a high degree of stiffness and that can withstand the temperatures experienced during the reflow of the solder without becoming molten.

A first end 18 of each pedestal 17 is rigidly coupled with face 14 of substrate 12. In particular embodiments of the present invention, this rigid coupling could be accomplished by coupling the two with an epoxy, a high-temperature solder, or other similar material. In alternative embodiments, pedestals 17 could be incorporated directly into face 14 of substrate 12 as spring-like protrusions fabricated as part of the solder mask (not illustrated) or uppermost organic build-up layer (not illustrated) of substrate 12. In another alternative embodiment, in which pedestal 17 comprises a stiff metal wire, the rigid coupling could be formed by wirebonding the first end 18 of each pedestal 17 onto a designated bump pad 16 (without a corresponding solder bump 15). Of course, these various embodiments are provided for illustration and example. It should be recognized by one skilled in the art that other materials and bonding methods could be used and still be within the teachings of the present invention.

While first end 18 of each pedestal 17 is rigidly coupled to face 14 of substrate 12, the second end 19 of each pedestal 17 is instead removably coupled with face 14. Typically this coupling is provided using a pedestal solder 20 to affix second end 19 to a bump pad adjacent to where the first end 18 is coupled to the substrate. In this manner, pedestal 17 is bent over approximately 180 degrees and held in a deformed state until the second end 19 is released by melting the pedestal solder 20. In order to ensure that second end 19 will not be released until after the solder bumps 15 have been reflowed, pedestal solder 20 is selected to have a melting point slightly higher than that of the solder comprising the solder bumps 15. In this way, solder bumps 15 may be reflowed by heating flip chip assembly 10 to a first temperature that is above the melting point of the solder bumps 15 but below the melting point of pedestal solder 20. After the solder bumps 15 have been reflowed and adhere to both faces 13 and 14 of flip chip assembly 10, assembly 10 may then be heated to a second, slightly higher temperature that is above the melting points of both the solder bumps 15 and the pedestal solder 20. This melts pedestal solder 20 and releases the second end 19 of each pedestal 17, allowing the pedestals 17 to return to their preferred, vertical orientation and force apart die 11 and substrate 12.

As shown in FIG. 1A, first end 18 and second 19 of each pedestal 17 are coupled with face 14 of substrate 12. However, it should be recognized that first and second ends 18 and 19 of pedestal 17 could be coupled to face 13 of die 11, instead of face 14 of substrate 12, and still be within the teachings of the present invention. In this orientation the operation of pedestals 17 would be much the same as described above, only acting to force substrate 12 away from die 11, rather than die 11 away from the substrate 12.

A better understanding of the operation of the pedestals 17 is provided by making reference to FIGS. 1A-1C in succession, each FIGS. 1A-1C showing a different stage in the flip chip assembly process.

FIG. 1A illustrates flip chip assembly 10 after the "pick and place" operation, but prior to the reflow of the solder bumps 15 and the deployment of pedestals 17. At this stage in the assembly process, the first and second ends 18 and 19 of each pedestal 17 are each coupled with face 14 of substrate 12. With pedestals 17 in this undeployed state, the die and substrate are separated by a die stand-off height of $H_1$.

In this state, flip chip assembly 10 is passed through a reflow oven to wet solder bumps 15. Inside the reflow oven, flip chip assembly 10 is heated above the melting point of the solder bumps 15, yet not above the melting point of pedestal solder 20. This causes the solder bumps 15 to reflow, or liquefy, and adhere to both the bump pads (not illustrated) of die 11 and the corresponding bump pads 16 of substrate 12.

After the solder bumps 15 have been reflowed, flip chip assembly 10 is then heated to a second, slightly higher temperature that is above the melting points of both the solder bumps 15 and the pedestal solder 20. This causes the pedestal solder 20 to liquefy, as well, and decouples the second ends 19 of the pedestals 17 from face 14. No longer restrained by pedestal solder 20, the pedestals 17 are then able to return to their preferred orientation, perpendicular to both faces 13 and 14. This action forces die 11 away from substrate 12, increasing the stand-off height to $H_2$. Because solder bumps 15 are still liquid, having been reflowed, and are adhering to both die 11 and substrate 12, this increase in the stand-off height also causes the solder bumps 15 (FIG. 1A) to elongate into solder columns 15 (FIG. 1B). This arrangement is shown in FIG. 1B, which illustrates flip chip assembly 10 following to the deployment of the separator pedestals 17.

As shown in FIG. 1B, once pedestals 17 have been deployed and have forced die 11 away from substrate 12, flip chip assembly 10 has a stand-off height of $H_2$, where $H_2$ is greater than $H_1$. This height $H_2$ is maintained by pedestals 17 while flip chip assembly 10 is removed from the reflow oven and the solder columns 15 are allowed to cool. This greater stand-off height helps reduce the stress that may result from any CTE mismatch between die 11 and solder columns 15. The greater stand-off height also helps ease the insertion of an underfill material into the gap 23 between die 11 and substrate 12 after solder columns 15 have solidified. Such an underfill material is shown in FIG. 1C.

As shown in FIG. 1C, after solder columns 15 have solidified, underfill material 21 is disposed between die 11 and substrate, forming a rigid coupling between the two. Typically, this underfill material 21 comprises a non-conductive epoxy, or some other suitable material.

Underfill material 21 is typically inserted into the gap 23 between die 11 and substrate 12 by flowing liquid underfill material under at least one edge of die 11. Capillary action then distributes the material uniformly between die 11 and substrate 12, surrounding each of the solder columns 15, until gap 23 is completely occluded. To ensure that gap 23 is completely filled, without any voids that could lead to high-stress concentrations or bump movement, underfill material is inserted until excess material extends out of all four edges of the die, forming a fillet 22 along each edge of gap 23 between die 11 and substrate 12, as shown in FIG. 1C.

Occluding underfill 21 between die 11 and substrate 12 helps to distribute the stress normally experienced at the joints between the die and solder columns over a wider area. This helps to strengthen the connection between the die and the substrate and helps prevent moisture and other contaminants from contacting the solder and other electrical connections.

The increased stand-off height offered by particular embodiments of the present invention also helps facilitate the insertion of underfill 21. This is due to the fact that many underfill materials are essentially slurries of solid particles (such as silica or alumina) suspended in a liquid (such as epoxy). As stand-off heights decrease, these materials become more difficult to insert into the gap between the die and the substrate, as the solid particles of the slurry resist flowing into the smaller gaps brought about by the decreasing stand-off heights. However, the greater stand-off heights offered by particular embodiments of the present invention help to reduce this problem, as the greater stand-off heights offer a larger opening for the underfill material to pass through.

Figure 2:
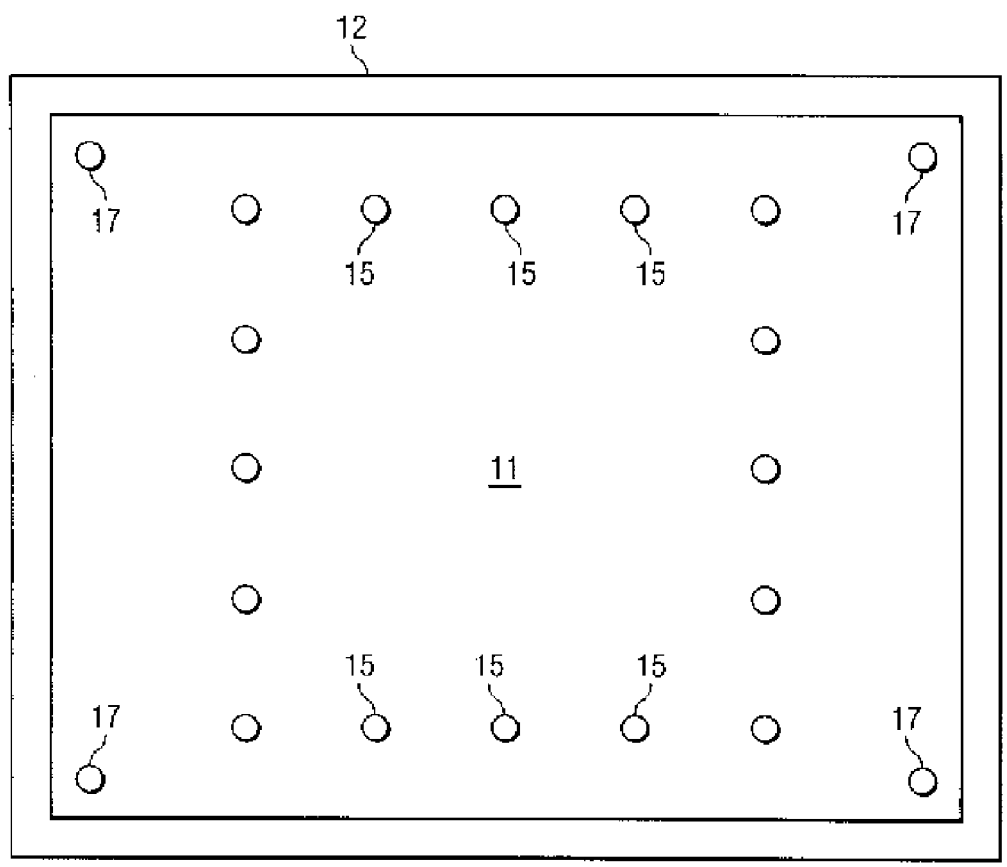
FIG. 2 illustrates a top view of the flip chip assembly illustrated in FIGS. 1A-1C.

Other aspects of particular embodiments of the present invention are also apparent from FIG. 2, which illustrates a top view of flip chip assembly 10, prior to the insertion of underfill material 21. As shown in FIG. 2, die 11 is disposed above substrate 12, which has a slightly larger footprint that die 11. Between die 11 and substrate 12, a plurality of solder bump/columns 15 form a rigid, electrical coupling between the interconnect layer (not illustrated) of die 11 and the bump pads 16 (FIGS. 1A-1C) of substrate 12. A plurality of separator columns 17 are also disposed between die 11 and substrate 12, and are operable to selectively force the two apart.

As shown in FIG. 2, four separator pedestals 17 are illustrated, with one pedestal 17 located generally adjacent to each of the corners of die 11. In this way, the four pedestals 17 apply a balanced force against die 11 so that the parallel relation between face 13 of die 11 and face 14 of substrate 12 is maintained when the plurality of pedestals 17 deploy. Of course, it should be recognized that other numbers of pedestals 17 could be used and still be within the teachings of the present invention. In fact, depending on the mass of the die 11 used in a particular embodiment and the material of construction of pedestals 17, many more pedestals 17 could be required to supply enough force to displace die 11. The minimum number of pedestals, however, that could be used and still maintain the parallel orientation of die 11 and substrate 12 would be three, as three pedestals would provide a structurally determinate arrangement (due to the fact that three points define a plane).

It should also be recognized that pedestals 17 could be located at various locations between die 11 and substrate 12, including adjacent to the edges and within the interior of die 11. The pedestals 17 need not be restricted to the corners of die 11. Again, numerous alternative arrangements of separator pedestals could be employed and still be within the teachings of the present invention. All that is required is that pedestals provide sufficient force to increase the stand-off height and yet are arranged so as to maintain the parallel relationship between face 13 of die 11 and face 14 of substrate 12.

Figure 3:
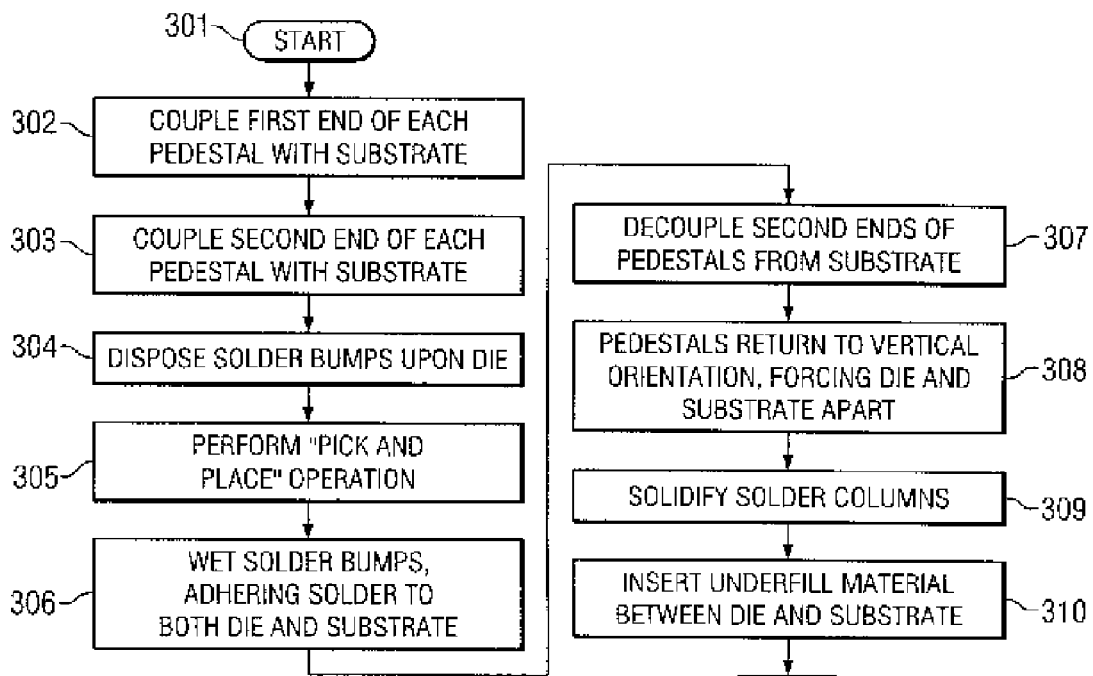
FIG. 3 illustrates a flowchart of a method for increasing die stand-off height in accordance with a particular embodiment of the present invention.

FIG. 3 illustrates a flowchart of a method to increase the stand-off height in a flip chip in accordance with a particular embodiment of the present invention.

After starting in block 301, the first end of each of the pedestals is coupled with the surface of the substrate in block 302. This may be accomplished using a variety of means, including coupling the first end to the substrate using epoxy or a high-temperature solder (that will remain solid during reflow of the solder bumps and deployment of the pedestals), or even by incorporating the pedestals into the substrate design itself, as discussed previously.

Next, the second end of each of the pedestals is coupled with the substrate in block 303. This may be performed using a pedestal solder that has a higher melting point that the solder used to form the solder bumps used to connect the die to the substrate. These solder bumps are disposed upon the die in block 304.

With the solder bumps in place on the die, a "pick and place" operation is performed in block 305, in which the solder bumps on the die are aligned with the corresponding bump pads on the substrate.

The solder bumps are then reflowed in block 306 such that the bumps adhere to both the bump pads of the die and the corresponding bump pads of the substrate. This may be accomplished by heating the flip chip assembly to a first temperature above the melting point of the solder bumps, but below the melting point of the pedestal solder. This causes the solder bumps to reflow and adhere to both the die and the substrate.

Once the solder bumps are liquefied and adhere to both the die and the substrate, the second ends of each of the pedestals are decoupled from the substrate in block 307. This is accomplished by heating the flip chip assembly to a second temperature above the melting points of both the solder bumps and the pedestal solder, such that the pedestal solder liquefies and releases the second ends of the pedestals. No longer restrained by the pedestal solder, the pedestals return to their preferred, undeformed state, perpendicular to the surfaces of the die and substrate in block 308. This forces the die and substrate apart, increasing the stand-off height of the flip chip assembly and elongating the solder bumps into solder columns.

Next, the flip chip is cooled in block 309, allowing the solder columns to solidify and form a rigid coupling between the die and substrate.

With the solder columns cooled, an underfill material is inserted between the die and substrate in block 310. After the underfill flows beneath the die and forms fillets around the edges of the die, the flip chip assembly is then heated in an oven to cure the underfill. The addition of the underfill helps to distribute the stress experienced at the solder joints over a larger area, strengthening the connection between the die and substrate. The underfill also serves to prevent any moisture or contaminants from interfering with the electrical connections.

Finally, with the underfill material in place and solidified, the process ends in block 311.

Thus, flip chip assemblies in accordance with particular embodiments of the present invention offer a variety of technical advantages. In particular, flip chip assemblies in accordance with particular embodiments of the present invention offer increased stand-off heights which may help to reduce the stress experiences at the joint between the solder columns and the interconnect layer of the flip chip. This increased stand-off height may also facilitate the insertion of an underfill material into the gap between the die and substrate of the flip chip, helping to distribute the stress typically experienced at the joint between the solder columns and the interconnect layer of the die, as well as providing a barrier to moisture and/or other contaminants.

Although particular embodiments of the method and apparatus of the present invention have been illustrated in the accompanying drawings and described in the foregoing detailed description, it will be understood that the invention is not limited to the embodiments disclosed, but is capable of numerous rearrangements, modifications, and substitutions without departing from the spirit of the invention as set forth and defined by the following claims.

What is claimed is:

1. A method of increasing die stand-off height in a flip chip, comprising:
   disposing a plurality of separator pedestals between a first face of a die and a second face of a substrate;
   the first face being generally parallel with, spaced apart from, and opposite the second face; and
   the plurality of separator pedestals being operable to selectively force the die and substrate apart.

2. The method of claim 1, wherein each of the plurality of separator pedestals comprises a resilient member biased to maintain an orientation generally perpendicular to the first and second faces.

3. The method of claim 2, further comprising:
   coupling a first end of each of the plurality of resilient members with the substrate; and
   removably coupling a second end of each of the plurality of resilient members with the substrate, such that the resilient member is in a deformed state.

4. The method of claim 3, wherein removably coupling a second end of each of the plurality of resilient members with the substrate comprises soldering.

5. The method of claim 2, further comprising:
   disposing a plurality of solder bumps between the first face and the second face.

6. The method of claim 5, further comprising:
   reflowing the plurality of solder bumps such that a first surface of each of the solder bumps adheres to the first face and a second surface of each of the solder bumps adheres to the second face.

7. The method of claim 6, further comprising:
   decoupling a second end of each of the plurality of resilient members from the substrate, such that each of the plurality of resilient members returns to an undeformed state in an orientation generally perpendicular to the first and second faces, forcing the die and substrate apart, and elongating the solder bumps into solder columns.

8. The method of claim 7, wherein removably coupling a second end of each of the plurality of resilient members with the substrate comprises soldering; and
   wherein decoupling the second end of each of the plurality of resilient members from the substrate comprises melting a solder coupling between the second end of each of the plurality of resilient members and the substrate.

9. The method of claim 7, further comprising:
   solidifying the solder columns such that the solder columns form a rigid coupling between the first face and the second face.

10. The method of claim 9, further comprising:
    inserting an underfill material between the first and second faces, such that the underfill material is in intimate contact with the first and second faces and the plurality of solder columns.

11. The method of claim 2, further comprising:
    coupling a first end of each of the plurality of resilient members with the die; and
    removably coupling a second end of each of the plurality of resilient members with the die, such that the resilient member is in a deformed state.

12. The method of claim 11, wherein removably coupling a second end of each of the plurality of resilient members with the die comprises soldering.

13. The method of claim 12, further comprising:
    disposing a plurality of solder bumps between the first face and the second face.

14. The method of claim 13, further comprising:
    reflowing the plurality of solder bumps such that a first surface of each of the solder bumps adheres to the first face and a second surface of each of the solder bumps adheres to the second face.

15. The method of claim 14, further comprising:
    decoupling the second end of each of the plurality of resilient members from the die, such that each of the plurality of resilient members returns to an undeformed state in an orientation generally perpendicular to the first and second faces, forcing the die and substrate apart, and elongating the solder bumps into solder columns.

16. The method of claim 15, wherein removably coupling a second end of each of the plurality of resilient members with the die comprises soldering; and
    wherein decoupling the second end of each of the plurality of resilient members from the die comprises melting a solder coupling between the second end of each of the plurality of resilient members and the die.

17. The method of claim 15, further comprising:
    solidifying the solder columns such that the solder columns form a rigid coupling between the first face and the second face.

18. The method of claim 17, further comprising:
    inserting an underfill material between the first and second faces, such that the underfill material is in intimate contact with the first and second faces and the plurality of solder columns.

* * * * *

UNITED STATES PATENT AND TRADEMARK OFFICE
CERTIFICATE OF CORRECTION

PATENT NO. : 7,598,124 B2  Page 1 of 1
APPLICATION NO. : 11/422446
DATED : October 6, 2009
INVENTOR(S) : Charles Anthony Odegard It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 611 days.

Signed and Sealed this

Twenty-eighth Day of September, 2010

David J. Kappos
*Director of the United States Patent and Trademark Office*